(12) United States Patent
Lee et al.

(10) Patent No.: US 8,779,494 B2
(45) Date of Patent: Jul. 15, 2014

(54) HIGH-K METAL GATE RANDOM ACCESS MEMORY

(75) Inventors: Tzung-Han Lee, Taipei (TW); Chung-Lin Huang, Taoyuan County (TW); Ron-Fu Chu, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 13/426,825

(22) Filed: Mar. 22, 2012

(65) Prior Publication Data
US 2013/0168751 A1    Jul. 4, 2013

(30) Foreign Application Priority Data
Jan. 4, 2012 (TW) .............................. 101100354 A (51) Int. Cl.
*H01L 29/94* (2006.01)
(52) U.S. Cl.
USPC .................... 257/306; 257/329; 257/E27.088
(58) Field of Classification Search
CPC ................................................ H01L 27/10805
USPC ........................................................ 257/296
See application file for complete search history.

(56) References Cited

U.S. PATENT DOCUMENTS

| | | | |
|---|---|---|---|
| 2009/0189217 A1* | 7/2009 | Yoon et al. | 257/329 |
| 2009/0191677 A1* | 7/2009 | Forbes | 438/268 |
| 2011/0042746 A1* | 2/2011 | Tak et al. | 257/348 |
| 2013/0069052 A1* | 3/2013 | Sandhu | 257/43 |

* cited by examiner

*Primary Examiner* — Eva Yan Montalvo
*Assistant Examiner* — Christopher Johnson
(74) *Attorney, Agent, or Firm* — Rosenberg, Klein & Lee (57) ABSTRACT

The instant disclosure relates to a high-k metal gate random access memory. The memory includes a substrate, a plurality of bit line units, source regions, gate structures, drain regions, word line units, and capacitance units. The substrate has a plurality of trenches, and the bit line units are arranged on the substrate. The source regions are disposed on the bit line units, and the gate structures are disposed on the source regions. Each gate structure has a metal gate and a channel area formed therein. The gate structures are topped with the drain regions. The word lines units are arranged between the source and drain regions. The capacitance units are disposed on the drain regions. Another memory is also disclosed, where each drain region and a portion of each gate structure are disposed in the respective capacitance unit, with the drain region being a lower electrode layer.

6 Claims, 7 Drawing Sheets

HIGH-K METAL GATE RANDOM ACCESS MEMORY

BACKGROUND OF THE INVENTION

1. Field of the Invention

The instant disclosure relates to a random access memory; in particular, to a high-k metal gate random access memory.

2. Description of Related Art

In the semiconductor industry, the technology associated with dynamic random access memory (DRAM) has been advancing continuously. This technological advancement has lead to size reduction for internal semiconductor components. The size reduction means higher storage density for the memory device. Specially, the internal channel length of the semiconductor components or the gaps in between the components has a decisive impact on component density and the critical dimension. In addition, the critical dimensions of the semiconductor components are limited by the manufacturing process. Taking the existing semiconductor manufacturing process for example, the critical factor that determines the dimensions of the semiconductor components is usually the minimum resolution of the photolithography process.

The minimum resolution will continue to shrink as the semiconductor technology continues to advance. However, there is a limit to which the semiconductor component can be downsized. The reason is during the downsizing process, the required physical and electrical properties of the semiconductor components may be lost due to excessive shrinkage. Taking a memory device as an example, by shrinking its critical dimension, the internal channel of the semiconductor component may be too short. One of the consequences is the overlapping of the bit trapping regions, which can cause errors in reading and/or writing the data. Besides, when the channel is too short, leakage of electricity is more likely to occur for the semiconductor component. Hence, the capacitance for the capacitor of the memory device becomes more difficult to maintain, such that the stored data may be easily lost. Thus, as the semiconductor components becoming increasingly smaller, it is necessary to change the structure of the components to maintain its physical and electrical properties.

SUMMARY OF THE INVENTION

The object of the instant disclosure is to provide a vertical high-k metal gate transistor, in particular a 4F2 DRAM to obtain a more capable memory device.

The high-k metal gate random access memory of the instant disclosure comprises a substrate, a plurality of bit line units, a plurality of source regions, a plurality of gate structures, a plurality of drain regions, a plurality of word line units, and a plurality of capacitance units. The substrate has a plurality of upward extending trenches formed thereon. The bit line units and the trenches are alternately arranged on the substrate. Each of the source regions is formed on the respective bit line unit. Each of the gate structures is connected to the respective source region. Each gate structure is constructed of a metal gate and a channel area formed therein. The base surface of each drain region is in connection with the respective gate structure. The word line units are arranged between the source and drain regions to partially surround the periphery of the gate structures, and each capacitance unit is arranged on top of the respective drain region.

The instant disclosure further discloses another high-k metal gate random access memory, which comprises: a substrate, a plurality of bit line units, a plurality of source regions, a plurality of gate structures, a plurality of drain regions, a plurality of word line units, and a plurality of capacitance units. The substrate has a plurality of upward extending trenches formed thereon. The bit line units and the trenches are alternately arranged on the substrate. Each of the source regions is formed on the respective bit line unit, and each of the gate structures is disposed on the respective source region. Each gate structure is constructed with a metal gate and a channel area is formed therein. Each channel area is bounded from the above by the respective drain region, where each drain region is formed inside the respective metal gate. The word line units are disposed in between the source regions and the drain regions. The word line units also partially surround the periphery of the gate structures. Each of the capacitance units has an upper electrode layer, a dielectric layer, and a lower electrode layer served by the respective drain region.

Based on the above, the instant disclosure provides a vertical high-k metal gate transistor, in particular a 4F2 DRAM, where the drain regions, the gate structures, and the source regions are vertically arranged. Thus, the horizontal area of the transistor can be reduced to increase the component density, while maintaining the performance of the transistors. Moreover, the high-k metal gate random access memory can reduce electricity leakage to enhance the electrical properties of the memory device.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The instant disclosure provides a high-k metal gate random access memory 10, which comprises a substrate 20, a plurality of bit line units 30, a plurality of source regions 41, a plurality of gate structures 42, a plurality of drain regions 45, a plurality of word line units 50, and a plurality of capacitance units 60.

Figure 1:
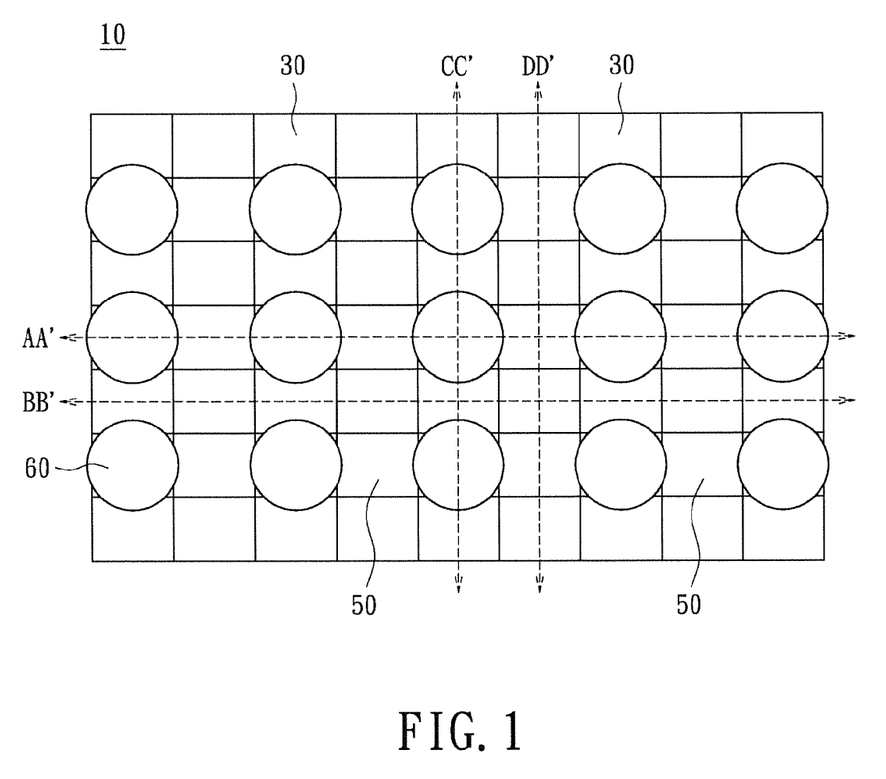
FIG. 1 shows a top view of a high-k metal gate random access memory of the instant disclosure.

Please refer to FIG. 1, which is a top view showing the structural layout of the high-k metal gate random access memory 10. The layout is addressed by strip-type bit line units 30 arranged parallel at a distance from one another and word line units 50 which run transversely with respect to the bit line units 30 and likewise run parallel at a distance from one another. In addition, one capacitance unit 60 is disposed at each intersection between the bit line units 30 and the word line units 50.

Embodiment 1

Figure 2:
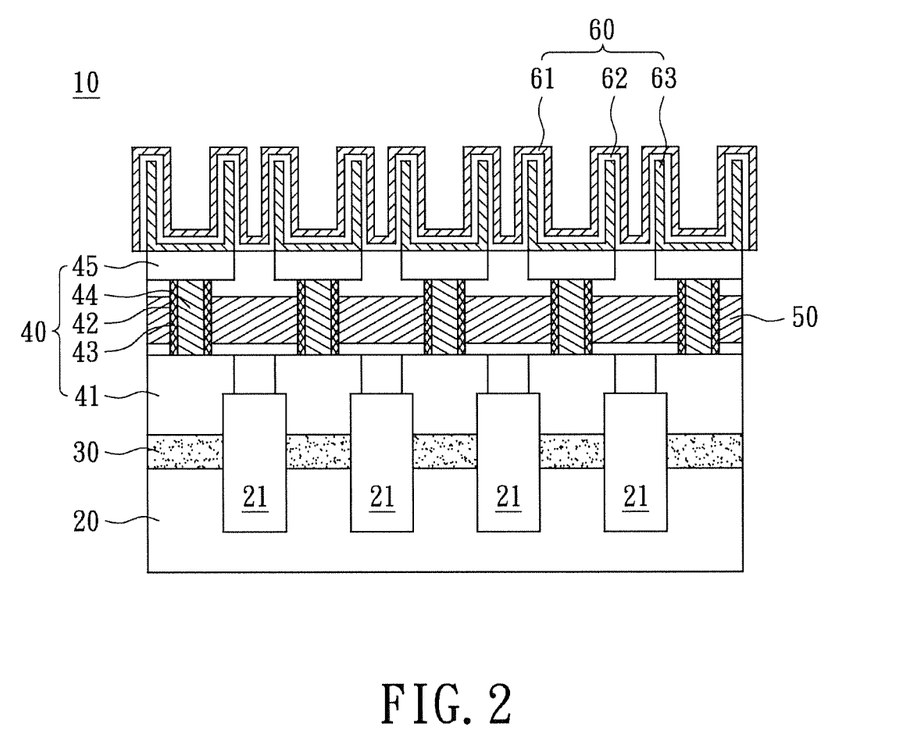
FIG. 2 shows a sectional view of the high-k metal gate random access memory in FIG. 1 taken along a cut-line AA' for a first embodiment of the instant disclosure.

Please refer to FIG. 2, which shows a sectional view of the random access memory 10 in FIG. 1 taken along a cut-line AA' for a first embodiment of the instant disclosure. The substrate 20 has a plurality of trenches 21 formed thereon, where the trenches 21 extend beyond the substrate 20. The trenches 21 are filled with insulating material such as silicon dioxide (silica), silicon nitride, borophosphosilicate glass (BPSG), phosphosilicate glass (PSG), undoped silicon glass (USG), or any material having high dielectric constant. However, the filler material is not restricted thereto. The bit line units 30 are arranged parallel at a distance from one another on the substrate 20. The bit line units 30 and the trenches 21 are alternately arranged on the substrate 20.

A plurality of high-k metal gate transistors 40 is disposed on the bit line units 30. Specially, the transistors 40 are perpendicular to the substrate 20, unlike the conventional ones which are parallel. Each of the source regions 41 is disposed on the respective bit line unit 30 and separated from one another by the respective trench 21. The source regions 41 are topped with gate structures 42. In this embodiment, the source regions 41 are made of polysilicons doped with n-type ions. Each of the gate structures 42 includes a metal gate 43 and a channel area 44 formed therein. More specially, the length of the channel area 44 is adjustable based on needs. In other words, the height of the gate structure 42 can be increased so that the length of the channel area 44 is also increased to reduce electricity leakage or improve electrical properties.

In this embodiment, the metal gate 43 can be made of titanium (Ti), titanium nitride (TiN), tantalum (Ta), tantalum nitride (TaN), tantalum carbide (TaC), tantalum silicide ($TaSi_2$), nickel silicide ($NiSi_2$), molybdenum silicide ($MoSi_2$), molybdenum nitride (MoN), tungsten (W), tungsten nitride (WN), or zirconium disilicide ($ZrSi_2$). However, the material used to construct the metal gate 43 is not restricted thereto. The channel area 44 is made of undoped polysilicon, polysilicon doped with ions, or any other high dielectric material. For the instant embodiment, the channel area 44 is preferably made of undoped polysilicon. The other end of each gate structures 42 is connected to respective drain region 45. In other words, the base surface of each drain region 45 is connected to the respective gate structure 42. The drain region 45 is made of polysilicon doped with n-type ions.

The word lines 50 are arranged between the source regions 41 and the drain regions 45 to partially surround the gate structures 42. In others words, the gate structures 42 and the word lines 50 are alternately arranged. Furthermore, the capacitance units 60 are disposed on the drain regions 45. Each of the capacitance units 60 includes an upper electrode layer 61, a dielectric layer 62, and lower electrode layer 63. Specially, each capacitance unit 60 is connected to the respective drain region 45 through the lower electrode layer 63. The upper electrode layer 61 is connected to a reference voltage.

Figure 3:
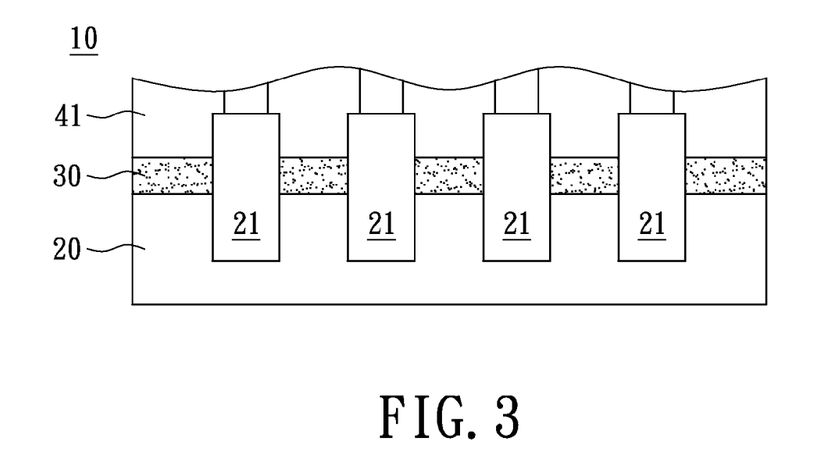
FIG. 3 shows a sectional view of the high-k metal gate random access memory in FIG. 1 taken along a cut-line BB' for the first embodiment of the instant disclosure.
Figure 4:
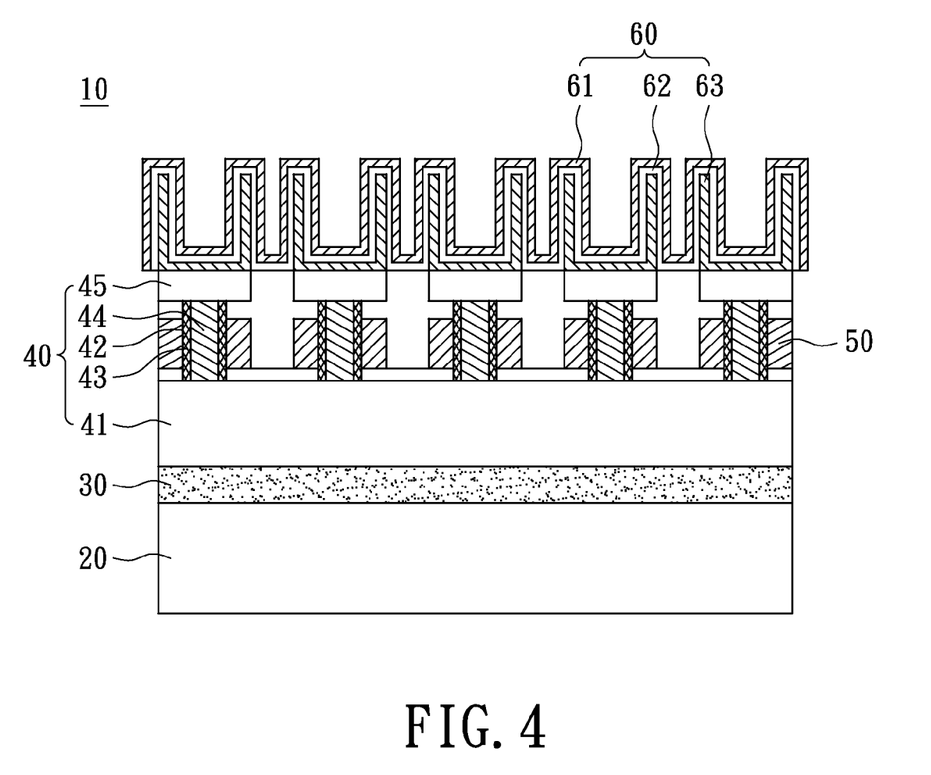
FIG. 4 shows a sectional view of the high-k metal gate random access memory in FIG. 1 taken along a cut-line CC' for the first embodiment of the instant disclosure.
Figure 5:
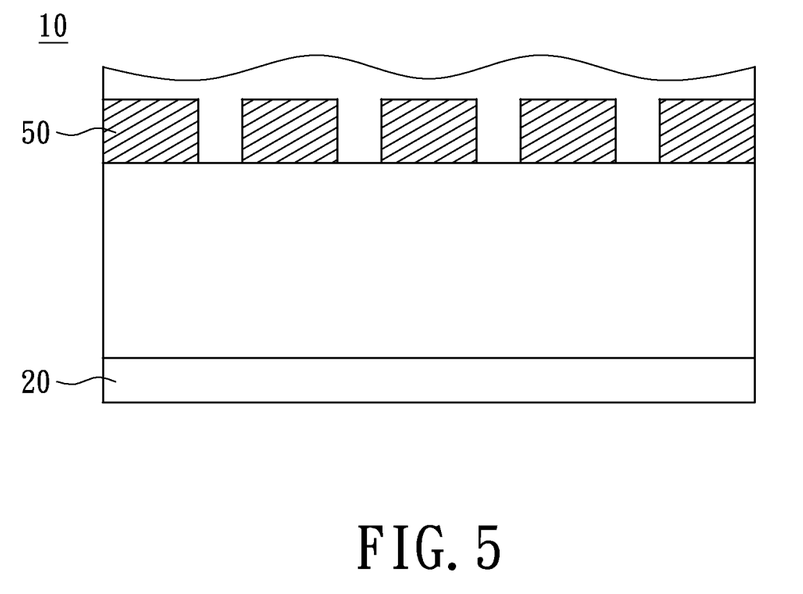
FIG. 5 shows a sectional view of the high-k metal gate random access memory in FIG. 1 taken along a cut-line DD' for the first embodiment of the instant disclosure.

Please refer to FIG. 3, where a sectional view of random access memory 10 of the first embodiment in FIG. 1 taken along a cut-line BB' is shown. As shown in the figure, the bit line units 30 are parallel. In addition, the bit line units 30 and the trenches 21 are alternately arranged. Please refer to FIG. 4, where a sectional view of the random access memory 10 in FIG. 1 taken along a cut-line CC' is shown. Since the trenches 21 are alternately arranged with the transistors 40 along the longitudinal direction, the trenches 21 are not shown in FIG. 4. Please refer to FIG. 5, where a sectional view taken along a cut-line DD' for the random access memory 10 in FIG. 1 is shown. The word lines 50 are parallel Embodiment 2

The instant disclosure further provides another high-k metal gate random access memory 10. Please refer to FIG. 6, where a sectional view of the random access memory 10 shown in FIG. 1 taken along the cut-line AA' for the second embodiment is shown. The difference between the instant embodiment and the preceding embodiment is this: for the instant embodiment, each of the drain regions 45 and a portion of each gate structure 42 are arranged inside the respective capacitance unit 60. For this configuration, the drain regions 45 are utilized as the lower electrode layers 63 of the capacitance units 60. Then, the dielectric layer 62 and the upper electrode layer 61 are formed correspondingly on the respective drain region 45 to form the capacitance unit 60. Other physical structures of the random access memory 10 of the instant embodiment are identical to the previous embodiment, thus no further elaboration shall be provided herein.

Figure 6:
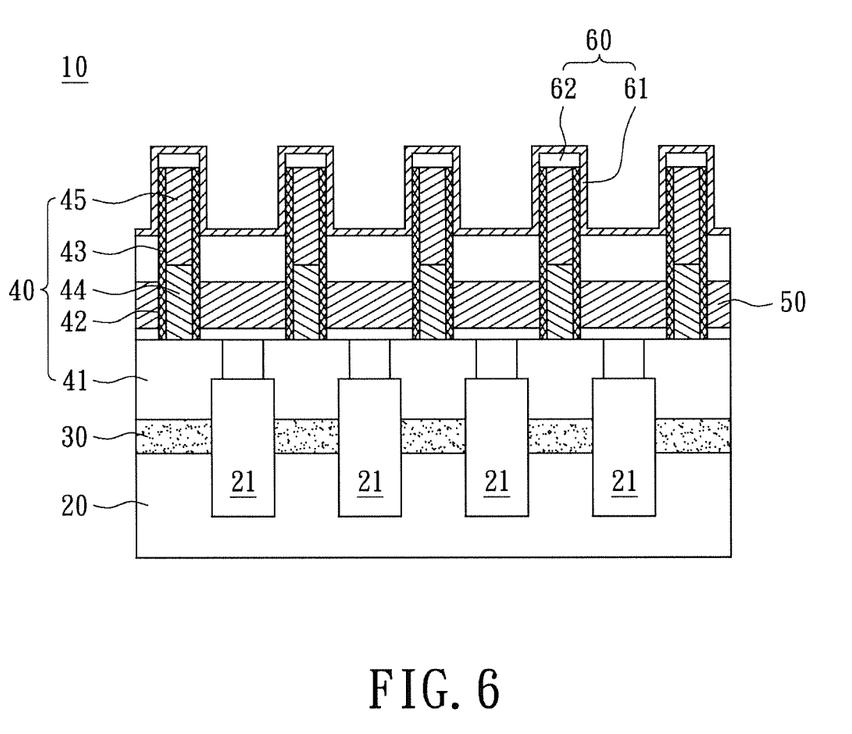
FIG. 6 shows a sectional view of a high-k metal gate random access memory in FIG. 1 taken along a cut-line AA' for a second embodiment of the instant disclosure.

Therefore, the metal gates 43 of the gate structures 42 of the instant embodiment cover the channel areas 44 and the drain regions 45 concurrently. Moreover, a portion of each metal gate 43 and a portion of each drain region 45 are extended inside the respective capacitance unit 60 to be in contact with the dielectric layer 62. Since the drain regions 45 have the abilities to conduct electricity, the drain regions 45 are capable of being utilized as the lower electrode layers 63 of the capacitance units 60. Specially, the length of the channel area 44 is adjustable based on needs so that the length of the channel area 44 is increased to reduce electricity leakage or improve electrical properties.

Figure 7:
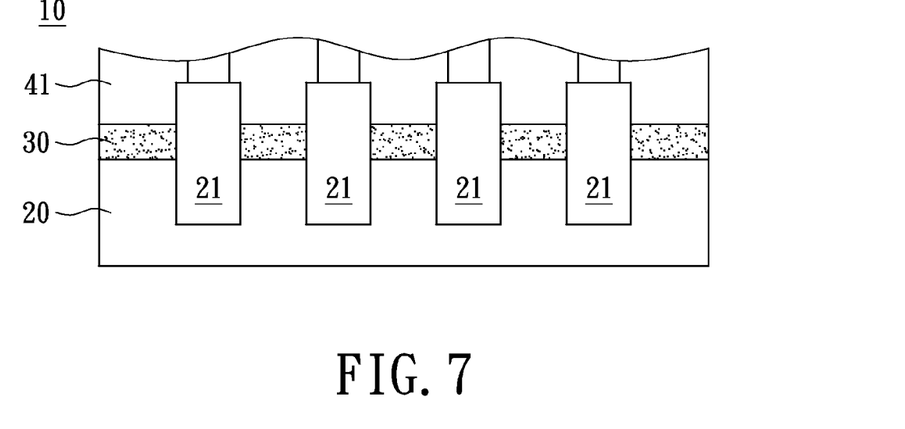
FIG. 7 shows a sectional view of the high-k metal gate random access memory in FIG. 1 taken along a cut-line BB' for the second embodiment of the instant disclosure.
Figure 8:
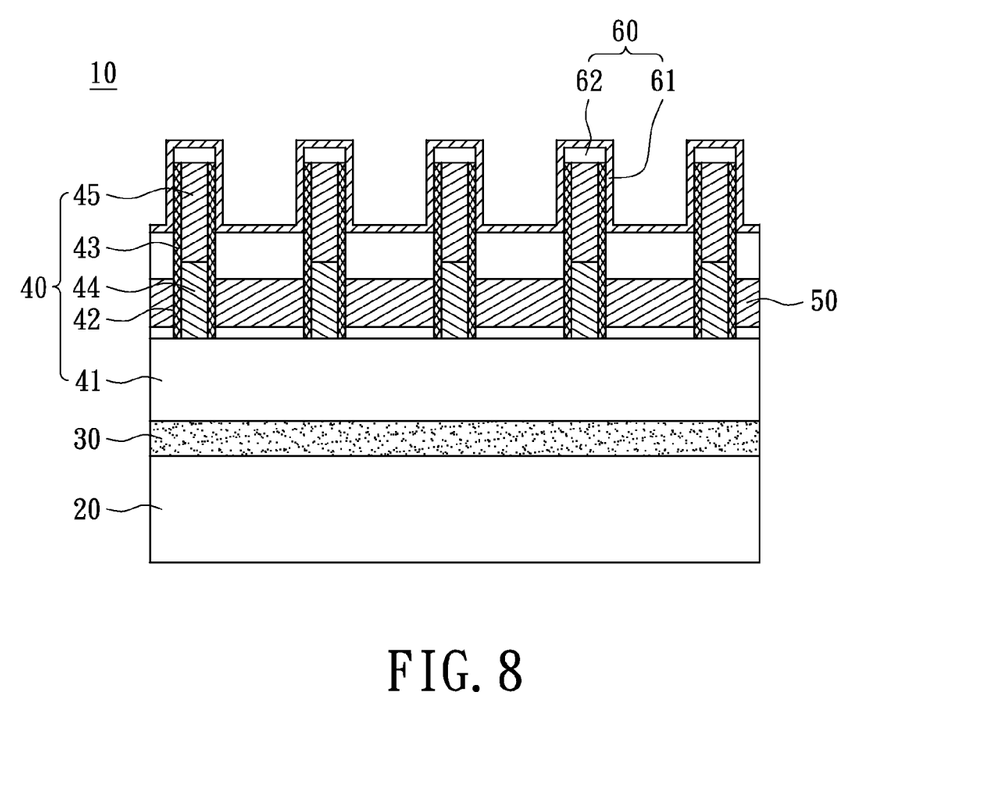
FIG. 8 shows a sectional view of the high-k metal gate random access memory in FIG. 1 taken along a cut-line CC' for the second embodiment of the instant disclosure.
Figure 9:
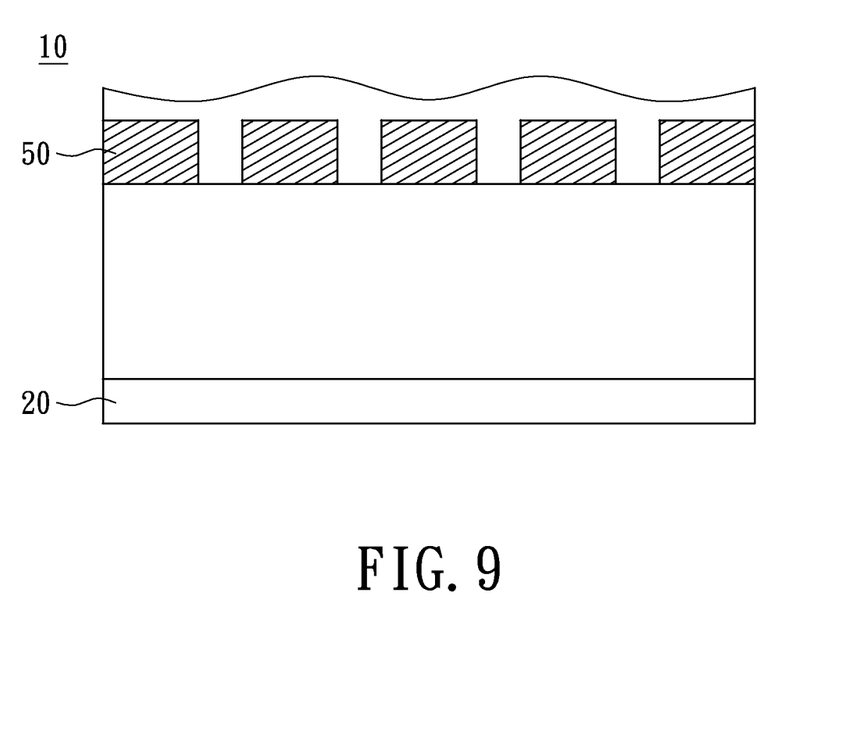
FIG. 9 shows a sectional view of the high-k metal gate random access memory in FIG. 1 taken along a cut-line DD' for the second embodiment of the instant disclosure.

Please refer to FIG. 7, where a sectional view of the random access memory 10 in FIG. 1 taken along the cut-line BB' for the second embodiment is shown. As shown in the figure, the bit line units 30 are parallel and alternately arranged with the trenches 21. Please refer to FIG. 8, where a sectional view of the random access memory 10 in FIG. 1 taken along the cut-line CC' for the second embodiment is shown. Since the trenches 21 and the transistors 40 are alternately arranged along the longitudinal direction, the trenches 21 are not shown in the figure. Please refer to FIG. 9, where a sectional view of the random access memory 10 in FIG. 1 taken along the cut-line DD' for the second embodiment is shown. The word lines 50 are parallel.

Based on above, the present invention provides a vertical transistor, in particular to a 4F2 DRAM, where the drain regions, the gate structures, and the source regions are vertically arranged so that the lateral area of the transistor can be reduced. Thus, the component density can be increased while maintaining the performance of the transistors. Besides, the occurrence of electricity leakage can be reduced and the electrical properties of the random access memory can be improved.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A high-k metal gate random access memory, comprising:
    a substrate having a plurality of trenches;
    a plurality of bit line units disposed on the substrate and alternately arranged with the trenches;
    a plurality of source regions, wherein each of the source regions is disposed on the respective bit line unit, wherein the source regions is made of polysilicon doped with n-type ions;
    a plurality of gate structures, wherein each of the gate structures is connected to the respective source region, wherein each gate structure has a metal gate and a channel area formed therein;
    a plurality of drain regions, wherein each drain region is disposed on the respective gate structure;
    a plurality of word lines units arranged between the source and drain regions, wherein the word line units partially cover the gate structures; and
    a plurality of capacitance units, wherein each capacitance unit is in connection with the respective drain region.

2. The high-k metal gate random access memory according to claim 1, wherein the channel area is made of undoped polysilicon.

3. The high-k metal gate random access memory according to claim 1, wherein the drain region is made of polysilicon doped with n-type ions.

4. A high-k metal gate random access memory, comprising:
    a substrate having a plurality of trenches;
    a plurality of bit line units disposed on the substrate and alternately arranged with the trenches;
    a plurality of source regions, wherein each of the source regions is disposed on the respective bit line unit, wherein the source regions is made of polysilicon doped with n-type ions;
    a plurality of gate structures, wherein each of the gate structures is connected to the respective source region, wherein each gate structure has a metal gate and a channel area formed therein;
    a plurality of drain regions, wherein each of the drain regions is disposed inside the respective metal gate, wherein each drain region is disposed on the respective channel area;
    a plurality of word lines units arranged between the source and the drain regions, wherein the word line units partially surround the gate structures; and
    a plurality of capacitance units, wherein each capacitance unit is formed by an upper electrode layer, a dielectric layer, and the corresponding drain region, wherein a portion of each drain region is directly in contact with the dielectric layer so that the portion of each drain region is served as a lower electrode layer of the respective capacitance unit.

5. The high-k metal gate random access memory according to claim 4, wherein the channel area is made of undoped polysilicon.

6. The high-k metal gate random access memory according to claim 4, wherein the drain region is made of polysilicon doped with n-type ions.

* * * * *